United States Patent
Avrahami et al.

(10) Patent No.: US 6,526,833 B1
(45) Date of Patent: Mar. 4, 2003

(54) RHOMBOHEDRAL-PHASE BARIUM TITANATE AS A PIEZOELECTRIC TRANSDUCER

(75) Inventors: Ytshak Avrahami, Somerville, MA (US); Harry L. Tuller, Wellesley, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/524,045

(22) Filed: Mar. 13, 2000

(51) Int. Cl.[7] .......................... G01N 3/00; H01L 41/04; C04B 35/00
(52) U.S. Cl. .................. 73/760; 310/328; 252/62.9 R
(58) Field of Search .................. 252/62.9 R; 501/137; 310/328; 73/760

(56) References Cited

U.S. PATENT DOCUMENTS

| | | | |
|---|---|---|---|
| 2,708,243 A | | 5/1955 | Brajer et al. ............... 310/328 |
| 4,019,915 A | * | 4/1977 | Miyauchi et al. .......... 264/1.21 |
| 4,862,029 A | | 8/1989 | Kasai et al. ................ 310/311 |
| 5,112,433 A | * | 5/1992 | Dawson et al. ......... 252/62.9 R |
| 5,142,186 A | | 8/1992 | Cross et al. ................ 310/332 |
| 5,155,072 A | | 10/1992 | Bruno et al. ................ 501/138 |
| 6,004,474 A | * | 12/1999 | Takenaka et al. ....... 252/62.9 R |
| 6,013,311 A | * | 1/2000 | Chatterjee et al. .......... 29/25.35 |
| 6,093,338 A | * | 7/2000 | Tani et al. ............ 252/62.9 PZ |
| 6,204,069 B1 | * | 3/2001 | Summerfelt et al. ......... 427/100 |
| 6,231,779 B1 | * | 5/2001 | Chiang et al. ................ 117/63 |

FOREIGN PATENT DOCUMENTS

GB    1 241 974    8/1971

OTHER PUBLICATIONS

Rehrig et al. "Piezoelectric properties of zirconium doped barium titanate single crystals grown by templated grain growth" J. Applied Physics, 86(3) :1657–1661 (1999).*

Jaffe, B et al., "Piezoelectric ceramics," Chapter 5, Academic Press, London, 1971.

Rehrig, P.W. et al., "Piezoelectric properties of zirconium–doped barium titanate single crystals grown by templated grain growth," *J. Applied Physics*, 86(3) :1657–1661 (1999).

Tawfik, A. et al., "Temperature dependence of electromechanical properties and strain in barium titanate hefnate transducers," *J. Materials Science Letters* 5(3) :305–306 (1986).

Park, S–E and Shrout, T.R., "Ultrahigh strain and piezoelectric behavior in relaxor based ferroelectric single crystals," *J. Appl. Phys.*, 82(4) :1804–1811 (1997).

Service, R.F., "Shape–Changing Crystals Get Shiftier," *Science*, 275:1878(1997).

Swartz, S.L., "Topics in Electronic Ceramics," *IEEE Transactions on Electrical Insulation*, 25(5) :935–955 (1990).

* cited by examiner

*Primary Examiner*—Harshad Patel
*Assistant Examiner*—Lilybett Martir
(74) *Attorney, Agent, or Firm*—Hamilton, Brook, Smith & Reynolds, P.C.

(57) ABSTRACT

A piezoelectric transducer includes a barium-titanate-based piezoelectric material having a poled, rhombohedral structure. The rhombohedral barium titanate structure can include a dopant, such as $KNbO_3$, $BaHfO_3$, $BaSnO_3$, $BaZrO_3$ or $KTaO_3$. The piezoelectric transducer can be used either as an actuator or as a sensor.

18 Claims, 3 Drawing Sheets

RHOMBOHEDRAL-PHASE BARIUM TITANATE AS A PIEZOELECTRIC TRANSDUCER

GOVERNMENT SUPPORT

The invention was supported, in whole or in part, by a grant, No. DAAH04-95-1-0104 from the U.S. Army Research Office. The Government has certain rights in the invention.

BACKGROUND OF THE INVENTION

Piezoelectric transducers are characterized in that they have the ability to (1) generate a voltage when stress is applied and/or (2) produce a mechanical force when a voltage is applied. These properties are generally referred to as the "piezoelectric effect" and are found only in a limited number of materials. Specifically, when stress is applied to these materials, displacement of the crystalline structure produces a charge (or voltage) proportional to the strain. Conversely, when an electric field (or voltage) is applied to the material, the shape of the crystalline structure changes, thereby changing the dimensions of the material.

The ability of a piezoelectric transducer to generate a voltage when strained enables its use as a sensor to detect displacement by monitoring the voltage that it generates. Conversely, the characteristic expansion or contraction of the piezoelectric transducer when a voltage is applied enables its use as an actuator to produce a controlled force or movement. Both of these effects are useful for a variety of electronic applications.

Tetragonal-phase barium titanate ($BaTiO_3$) was once the material of choice for fabricating piezoelectric transducers. However, tetragonal-phase barium titanate transducers were largely displaced from use when lead-based piezoelectric materials (e.g., lead zirconate titanate, a.k.a., PZT) were discovered due to the superior performance in terms of the much higher strain levels and the higher piezoelectric coefficient of the lead-based materials relative to traditional tetragonal-phase barium titanate. Quartz is also used as a piezoelectric material. However, the magnitude of the piezoelectric effect exhibited by quartz is negligible in comparison to that exhibited by the lead-based materials that are used.

SUMMARY OF THE INVENTION

Notwithstanding the advantages of using lead-based materials, such as PZT, as piezoelectric transducers, use of these materials can cause significant problems. Because lead is toxic, its use often presents serious health and environmental hazards. Additionally, lead has a high vapor pressure and is highly reactive. Consequently, processes for fabricating a material with the desired lead-based piezoelectric composition are very unpredictable and unreliable, and the defect rates of the resulting product are very high.

In contrast to known lead-based piezoelectric transducers, a piezoelectric transducer of this invention has a barium-titanate-based composition in a poled, rhombohedral structure. In preferred embodiments, the piezoelectric material is stable at room temperature (and atmospheric pressure). The rhombohedral structure of the barium-titanate-based material can be stabilized at room temperature by doping the barium titanate with an appropriate concentration of $KNbO_3$, $BaHfO_3$, $BaSnO_3$, $BaZrO_3$ or $KTaO_3$.

The transducer can further include electrical contacts configured to allow for transmission of a voltage to or from the barium-titanate-based piezoelectric material. Where the transducer is used as an actuator, a voltage source coupled with the transducer can supply a voltage to the transducer to generate physical displacement, or strain, in the piezoelectric material. Further, a processor programmed to determine the voltage necessary to produce a particular strain in the barium-titanate-based material and further programmed to instruct the voltage source to generate that voltage can be put in communication with the voltage source to perform this function. In preferred embodiments, the barium-titanate-based material exhibits an absolute peak strain of at least about 0.1% when actuated by a voltage source. Where the transducer is used as a sensing device, a sensor can be coupled with the transducer and used to detect the electric field generated by the barium-titanate-based piezoelectric material under strain. Further, a processor programmed to calculate displacement as a function of the generated electric field can be put in communication with the sensor to calculate the displacement of the barium-titanate-based piezoelectric material.

The apparatus and methods of this invention offer a number of advantages over the prior art. A piezoelectric transducer of this invention offers relatively-high strain levels and piezoelectric constants far higher than those of tetragonal-phase barium titanate and comparable to those of PZT and other lead-based piezoelectrics without the toxicity and unpredictability that plague the use of lead-based materials. Moreover, barium titanate is inexpensive and the know-how required to process it for piezoelectric applications is already in place due to the known use of conventional, tetragonal-phase barium titanate. Further, the addition of a respective percentage of a dopant, such as $BaZrO_3$, $BaHfO_3$, $KNbO_3$ $BaSnO_3$ or $KTaO_3$ within a particular concentration range in accordance with aspects of this invention results in a barium-titanate-based material that can exist in a rhombohedral crystalline structure at or above room temperature and ambient atmospheric pressure, thereby facilitating its use for room-temperature transducer applications.

BRIEF DESCRIPTION OF THE DRAWINGS

The foregoing and other objects, features and advantages of the invention will be apparent from the following more-particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

A description of preferred embodiments of the invention follows. These embodiments are provided by way of example and not as limitations of the invention.

A piezoelectric transducer of this invention comprises a barium-titanate-based piezoelectric material having a poled, rhombohedral structure.

The term, "poled," is used herein to describe a structure with a net polarization. During "poling," an electric field is applied to the material at high temperature (but below the Curie temperature of the material) to preferentially align the "domains" (wherein one or more domains are formed in each grain of the crystal structure) toward the direction of the applied field. Poling serves an important function in piezoelectric materials and generally distinguishes piezoelectric materials from similar materials used in other applications, such as those used as capacitors where the structure of the composition is not poled. A poled composition will have an effectively lower dielectric constant at low fields compared to an unpoled sample. In the case of high-strain materials, poling increases the maximum possible strain of the material.

A "rhombohedral" crystal lattice can be characterized in that the three axes of a unit cell are of equal length, and the three angles between axes are the same, and are not right angles. The rhombohedral structure is further defined by its location on the phase diagrams of FIGS. 1–4 for various compositions of barium-titanate-based materials.

In addition to barium titanate ($BaTiO_3$), the transducer can also include other compositions in the form, for example, of dopants, substitutions, and additives for controlling properties such as resistivity, microstructure, sintering temperature, etc. However, the rhombohedral-phase barium titanate provides the essential structure for providing the desired piezoelectric properties. Accordingly, the term, "barium-titanate-based," is intended to include compositions with other ingredients and is not limited to pure barium titanate. Moreover, preferred embodiments of this invention include at least one dopant in the barium-titanate-based composition.

In a pure barium titanate composition, the crystalline phase will transform from rhombohedral to orthorhombic when the temperature of the composition rises above about −90° C. Accordingly, the rhombohedral phase cannot ordinarily be maintained in a barium titanate composition at or near room temperature (approximately 25° C.). With the addition of a suitable concentration of any of a number of selected dopants, however, the rhombohedral structure of the barium-titanate-based composition can be maintained at or above room temperature at atmospheric pressure (approximately 101 kPa). Dopants selected for this purpose include potassium niobate ($KNbO_3$), barium hafiate ($BaHfO_3$), barium stannate ($BaSnO_3$), barium zirconate ($BaZrO_3$) and potassium tantalate ($KTaO_3$).

Figure 1:
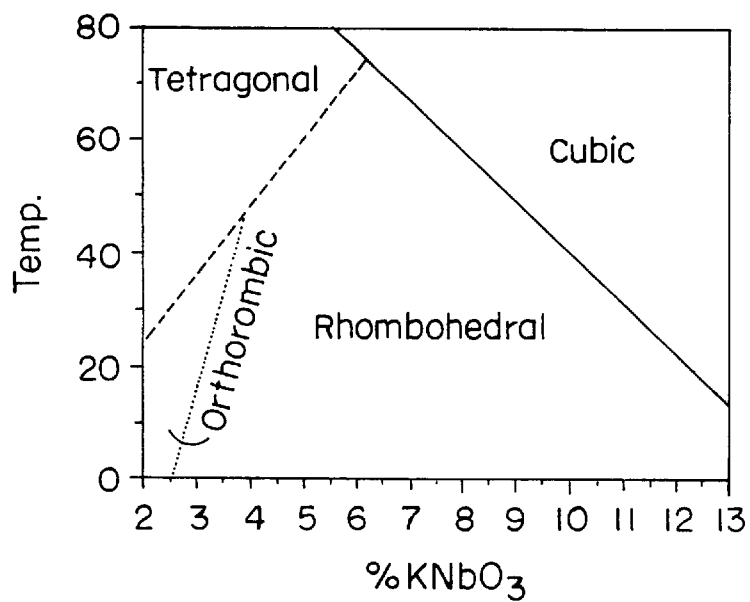
FIG. 1 is a phase diagram of a barium-titanate-based composition doped with varying percentages of $KNbO_3$.
Figure 2:
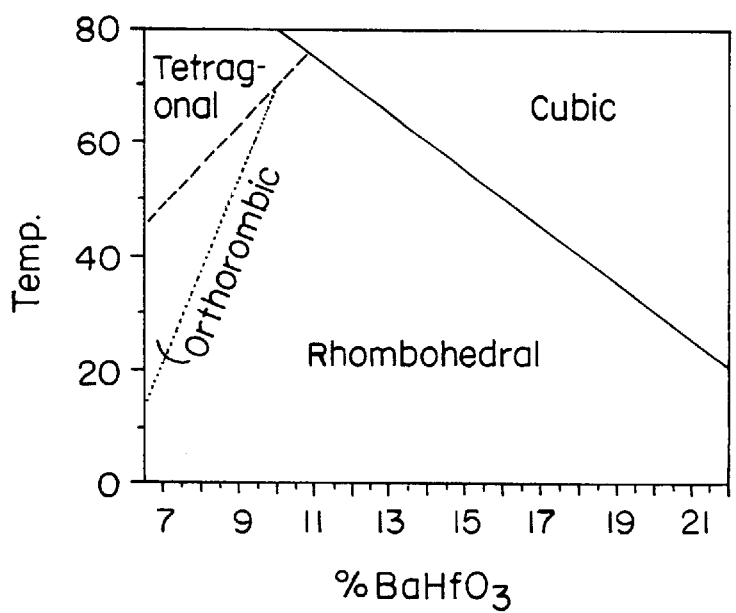
FIG. 2 is a phase diagram of a barium-titanate-based composition doped with varying percentages of $BaHfO_3$.
Figure 3:
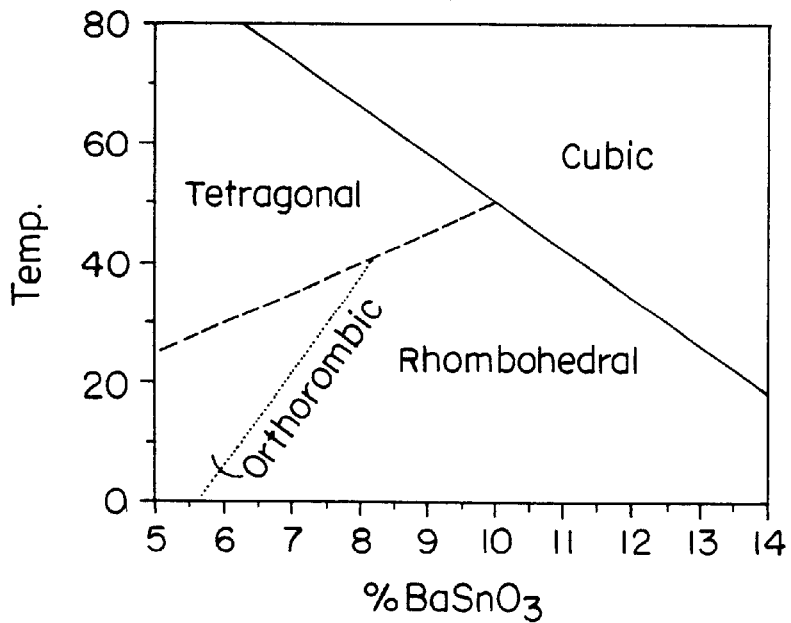
FIG. 3 is a phase diagram of a barium-titanate-based composition doped with varying percentages of $BaSnO_3$.
Figure 4:
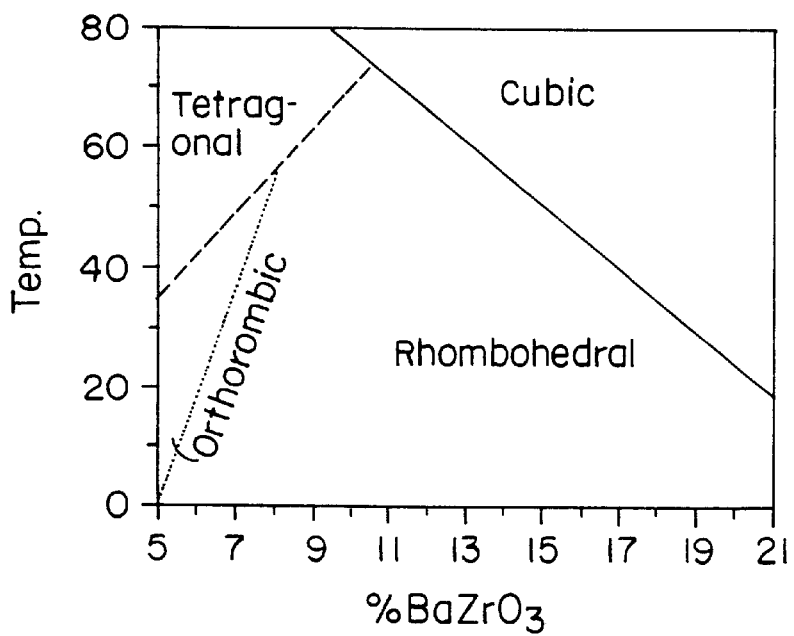
FIG. 4 is a phase diagram of a barium-titanate-based composition doped with varying percentages of $BaZrO_3$.

Phase diagrams for several barium-titanate-based compositions including $KNbO_3$, $BaHfO_3$, $BaSnO_3$ or $BaZrO_3$ are provided in FIGS. 1–4, respectively. In each of the phase diagrams, the molar percentage of the dopant is provided on the horizontal axis, with temperature in ° C. plotted on the vertical axis. The phase diagram for $KTaO_3$, not illustrated, is very similar to that for KNbO3 (FIG. 1). Consistent with FIGS. 1–4, approximate ranges of molar concentrations of each dopant that will produce a rhombohedral structure at room temperature and to temperatures above 50° C. are shown in the table, below.

| Material | Doping for rhombohedral phase at room temp. | Range of particular interest (rhomb@T > 50C) |
|---|---|---|
| $KNbO_3$ | 3.5–12% | 4.5–8.5% |
| $KTaO_3$ | 3.5–12% | 4.5–8.5% |
| $BaHfO_3$ | 7–22% | 9–16% |
| $BaZrO_3$ | 6–21% | 8–15% |
| $BaSnO_3$ | 7–14% | 9.5–10.5% |

Alternatively, these and other dopants can be used in combination, wherein lesser amounts of each of two or more dopants can generally be added to preserve the rhombohedral crystalline structure in the barium-titanate-based composition at room temperature and above.

In a preferred method for forming a poled, rhombohedral-phase, barium-titanate-based transducer of this invention, powders of barium titanate and the selected dopant are mixed and ball milled. The mixed composition is then sintered at a temperature in a range between about 700° C. and about 1200° C. The sintered composition is then crushed and ball milled again. Next, the composition is pressed to form the desired shape and re-sintering at about 1200° C. The pressed composition is then poled at an elevated temperature below the Curie temperature of the composition. The conductive contacts can then be painted on the finished piezoelectric transducer.

Figure 5:
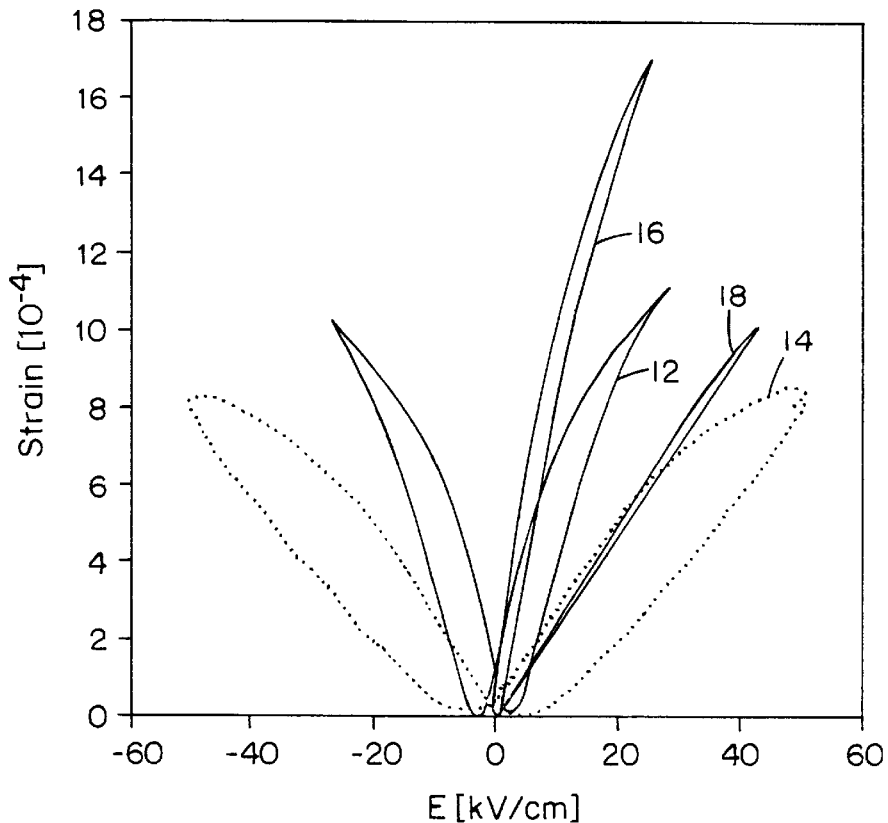
FIG. 5 is a graph illustrating the strain level of a pair of rhombohedral-phase barium-titanate-based compositions of this invention and that of a pair of PZT compositions of the prior art.

A chart comparing the electromechanical behavior of a pair of barium-titanate-based compositions (one doped with $BaZrO_3$ and the other doped with $KNbO_3$) with the electromechanical behavior of a pair of PZT compositions is provided in FIG. 5. In the chart, the applied electric field is represented on the horizontal axis and is expressed in kV/cm, while strain is represented on the vertical axis in units of $10^{-4}$. The observed strain in a barium-titanate-based composition doped with 7% $BaZrO_3$ is represented by plot 12. Meanwhile, the observed strain in a barium-titanate-based composition doped with 3.8% $KNbO_3$ is represented by plot 14. For comparison, the strain behavior of a pair of PZT compositions reported in Park et al., "Ultrahigh Strain and Piezoelectric Behavior in Relaxor Based Ferroelectric Single Crystals," *Journal of Applied Physics* 82(4), Aug. 15, 1997, 1804–1811, are provided as plots 16 (soft PZT-5H) and 18 (hard PZT-8). As is evident in the chart of FIG. 5, the strain rates for the two doped, rhombohedral, barium-titanate-based compositions (shown in plots 12 and 14) were competitive with the strain levels for the two PZT compositions (shown in plots 16 and 18).

Figure 6:
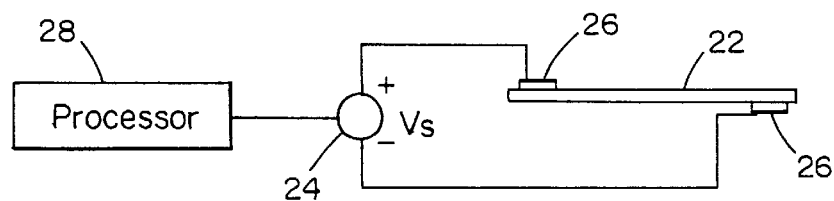
FIG. 6 is a drawing, partially schematic, of a piezoelectric actuator apparatus of this invention.

The piezoelectric transducer of this invention can be operated either as an actuator or as a transducer. A piezoelectric actuator apparatus of this invention is illustrated in FIG. 6. The apparatus includes a poled, rhombohedral-phase barium-titanate-based transducer 22; a voltage source 24 in electrical contact with contacts 26 on the transducer for supplying a voltage to the transducer 22; and a processor 28 in communication with the voltage source 24 and programmed to determine the voltage necessary to produce a particular strain in the barium-titanate-based piezoelectric material and to instruct the voltage source 24 to generate that voltage. Accordingly, the processor 28 governs displacement of the transducer 22 by sending commands to the voltage source 24. The voltage source, in turn, supplies a voltage to the barium-titanate-based piezoelectric transducer 22 to produce the desired strain in the transducer 22.

Figure 7:
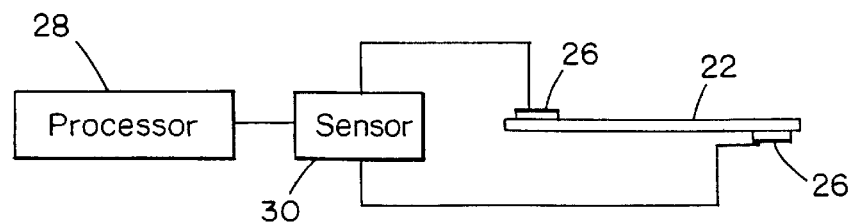
FIG. 7 is a drawing, partially schematic, of a piezoelectric sensor apparatus of this invention.

A piezoelectric sensor apparatus of this invention is illustrated in FIG. 7. The apparatus includes a poled, rhombohedral-phase barium-titanate-based transducer 22; a sensor 30 coupled with the transducer 22 for detecting an electric field generated by the barium-titanate-based piezoelectric material when the transducer 22 is strained; and a processor 28 coupled with the sensor 30 and programmed to calculate displacement (or strain) of the transducer 22 as a function of the generated electric field. Accordingly, when stress is applied to the barium-titanate-based piezoelectric transducer 22, the strain of the barium-titanate-based piezoelectric material produces a voltage that is detected by the sensor 30, which communicates that voltage to the processor 28, which calculates the degree of displacement therefrom.

Representative applications for which the piezoelectric transducers of this invention can be used include applications in optics, photonics and measuring technology; disk drives; microelectronics; precision mechanics and mechanical engineering; and life science, medicine and biology. Specific applications in each of these fields are outlined, below.

In optics, photonics and measuring technology, a piezoelectric transducer of this invention can be used for image stabilization, scanning microscopy, auto-focus systems, interferometry, fiber optic alignment and switching, fast mirror scanners, adaptive and active optics, laser tuning, mirror positioning, holography, and simulations of vibrations.

In disk drive applications, a piezoelectric transducer of this invention can be used for MR head testing, pole tip recession, disk spin stands, and vibration cancellation.

In microelectronics, a piezoelectric transducer of this invention can be used for nano-metrology, wafer and mask positioning, critical dimensions measurement, microlithography, inspection systems, and vibration cancellation.

In precision mechanics and mechanical engineering applications, a piezoelectric transducer of this invention can be used for vibration cancellation; structural deformation; out-of-roundness grinding, drilling and turning; tool adjustment; wear correction; needle valve actuation; micro pumps; linear drives; piezo hammers; knife edge control in extrusion tools; micro-engraving systems; and shock wave generation.

In life science, medicine and biology applications, a piezoelectric transducer of this invention can be used for patch-clamp drives, gene technology, micro manipulation, cell penetration, micro dispensing devices, audiophysiological stimulation, and shock wave generation.

Note, however, that the list of applications, above, is far from exhaustive in terms of the technologies in which the piezoelectric transducer of this invention can be used.

While this invention has been particularly shown and described with references to preferred embodiments thereof, it will be understood by those skilled in the art that various changes in form and details may be made therein without departing from the scope of the invention encompassed by the appended claims.

What is claimed is:

1. A piezoelectric transducer comprising a barium-titanate-based piezoelectric material including a dopant selected from the group consisting of $KNbO_3$, $KTaO_3$, $BaHfO_3$, and $BaSnO_3$, the barium-based piezoelectric material having a poled, rhombohedral structure that is stable at or above ambient room-temperature conditions, and exhibiting an absolute peak strain of at least about 0.1% when actuated by a voltage source.

2. The piezoelectric transducer of claim 1, wherein the $KNbO_3$ dopant forms about 3.5 mol % to about 12 mol % of the barium-titanate-based piezoelectric material.

3. The piezoelectric transducer of claim 1, wherein the $KNbO_3$ dopant forms about 4.5 mol % to about 8.5 mol % of the barium-titanate-based piezoelectric material.

4. The piezoelectric transducer of claim 1, wherein the $BaHfO_3$ dopant forms about 7 mol % to about 22 mol % of the barium-titanate-based piezoelectric material.

5. The piezoelectric transducer of claim 1, wherein the $BaHfO_3$ dopant forms about 9 mol % to about 16 mol % of the barium-titanate-based piezoelectric material.

6. The piezoelectric transducer of claim 1, wherein the $BaSnO_3$ dopant forms about 7 mol % to about 14 mol % of the barium-titanate-based piezoelectric material.

7. The piezoelectric transducer of claim 1, wherein the $BaSnO_3$ dopant forms about 10 mol % of the barium-titanate-based piezoelectric material.

8. The piezoelectric transducer of claim 1, wherein the $KTaO_3$ dopant forms about 3.5 mol % to about 12 mol % of the barium-titanate-based piezoelectric material.

9. The piezoelectric transducer of claim 1, wherein the $KTaO_3$ dopant forms about 4.5 mol % to about 8.5 mol % of the barium-titanate-based piezoelectric material.

10. An apparatus comprising:

a piezoelectric transducer made from a barium-titanate-based piezoelectric material including a dopant selected from the group consisting of $KNbO_3$, $KTaO_3$, $BaHfO_3$, and $BaSnO_3$, and having a poled, rhombohedral structure that is stable at or above ambient room-temperature conditions; and electrical contacts attached to the transducer and configured to allow for transmission of a voltage to or from the transducer.

11. The apparatus of claim 10, further comprising a voltage source electrically coupled to the contacts.

12. The apparatus of claim 11, further comprising a processor programmed to determine the voltage necessary to produce a particular strain in the barium-titanate-based piezoelectric material and to instruct the voltage source to generate said voltage.

13. The apparatus of claim 10, further comprising a sensor coupled with the contacts for detecting an electric field generated by the barium-titanate-based piezoelectric material under strain.

14. The apparatus of claim 13, further comprising a processor in communication with the sensor, the processor programmed to calculate displacement as a function of the generated electric field.

15. A piezoelectric tucer comprising a barium-titanate-based piezoelectric material including a dopant $KNbO_3$, the barium-based piezoelectric material having a poled, rhombohedral structure that is stable at or above ambient room-temperature conditions, and exhibiting an absolute peak strain of at least about 0.1% when actuated by a voltage source.

16. A piezoelectric transducer comprising a barium-titanate-based piezoelectric material including a dopant $KTaO_3$, the barium-based piezoelectric material having a poled, rhombohedral structure that is stable at or above ambient room-temperature conditions, and exhibiting an absolute peak sty of at least about 0.1% when actuated by a voltage source.

17. A piezoelectric transducer comprising a barium-titanate-based piezoelectric material including a dopant $BaHfO_3$, the barium-based piezoelectric material having a poled, rhombohedral structure that is stable at or above ambient room-temperature conditions, and exhibiting an absolute peak strain of at least about 0.1% when actuated by a voltage source.

18. A piezoelectric transducer comprising a barium-titanate-based piezoelectric material including a dopant $BaSnO_3$, the barium-based piezoelectric material having a poled, rhombohedral structure that is stable at or above ambient room-temperature conditions, and exhibiting an absolute peak strain of at least about 0.1% when actuated by a voltage source.

* * * * *